US 11,804,403 B2

(12) United States Patent
Huang et al.

(10) Patent No.: US 11,804,403 B2
(45) Date of Patent: Oct. 31, 2023

(54) SEMICONDUCTOR STRUCTURE AND METHOD FOR FORMING THE SAME

(71) Applicant: United Semiconductor (Xiamen) Co., Ltd., Fujian (CN)

(72) Inventors: Ji He Huang, Suzhou (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 274 days.

(21) Appl. No.: 17/382,379

(22) Filed: Jul. 22, 2021

(65) Prior Publication Data

US 2022/0399226 A1   Dec. 15, 2022

(30) Foreign Application Priority Data

Jun. 11, 2021   (CN) .......................... 202110652469.3

(51) Int. Cl.
  *H01L 21/768*   (2006.01)
  *H01L 23/528*   (2006.01)
  *H01L 23/532*   (2006.01)

(52) U.S. Cl.
  CPC .... *H01L 21/7682* (2013.01); *H01L 21/76819* (2013.01); *H01L 21/76835* (2013.01); *H01L 23/5283* (2013.01); *H01L 23/53295* (2013.01)

(58) Field of Classification Search
  CPC ........... H01L 21/7682; H01L 21/76819; H01L 21/76835; H01L 21/76837; H01L 23/5329; H01L 23/5283; H01L 23/53295
  See application file for complete search history.

(56) References Cited

U.S. PATENT DOCUMENTS

| | | | | |
|---|---|---|---|---|
| 6,159,845 A | * | 12/2000 | Yew | H01L 21/76834 |
| | | | | 257/E21.589 |
| 6,399,476 B2 | * | 6/2002 | Kim | H01L 21/7682 |
| | | | | 438/668 |
| 7,807,563 B2 | * | 10/2010 | Gabric | H01L 21/7682 |
| | | | | 257/640 |
| 7,868,455 B2 | * | 1/2011 | Chen | H01L 21/76835 |
| | | | | 257/750 |
| 8,735,279 B2 | * | 5/2014 | Horak | H01L 21/7682 |
| | | | | 257/386 |
| 9,490,163 B2 | * | 11/2016 | Huang | H01L 23/5222 |
| 9,496,224 B2 | | 11/2016 | Ting | |
| 9,728,447 B2 | | 8/2017 | Lin | |

(Continued)

FOREIGN PATENT DOCUMENTS

| | | |
|---|---|---|
| CN | 105097663 A | 11/2015 |
| CN | 106711084 A | 5/2017 |
| CN | 109478534 A | 3/2019 |

*Primary Examiner* — Jaehwan Oh
*Assistant Examiner* — John M Parker
(74) *Attorney, Agent, or Firm* — Winston Hsu

(57) ABSTRACT

A semiconductor structure and a method for forming the same are disclosed. The method includes the steps of forming a first dielectric layer on a substrate, forming a plurality of first interconnecting structures in the first dielectric layer, forming at least a trench in the first dielectric layer and between the first interconnecting structures, performing a sputtering deposition process to form a second dielectric layer on the first dielectric layer, wherein the second dielectric layer at least partially seals an air gap in the trench, and forming a third dielectric layer on the second dielectric layer.

17 Claims, 8 Drawing Sheets

(56) References Cited

U.S. PATENT DOCUMENTS

| | | | |
|---|---|---|---|
| 9,892,961 B1 | 2/2018 | Cheng | |
| 11,183,421 B2* | 11/2021 | Hsieh | H01L 23/5222 |
| 2004/0113274 A1 | 6/2004 | Engelhardt | |
| 2009/0298282 A1* | 12/2009 | Yun | H01L 21/7682 |
| | | | 438/653 |
| 2009/0309230 A1* | 12/2009 | Cui | H01L 23/53238 |
| | | | 257/773 |
| 2012/0319279 A1* | 12/2012 | Isobayashi | H01L 23/53238 |
| | | | 438/653 |
| 2013/0323930 A1* | 12/2013 | Chattopadhyay | |
| | | | H01L 21/76829 |
| | | | 156/345.26 |
| 2018/0033691 A1* | 2/2018 | You | H01L 21/76807 |
| 2018/0204801 A1* | 7/2018 | Tung | H01L 21/02266 |
| 2020/0075395 A1* | 3/2020 | Lin | H01L 21/76835 |

\* cited by examiner

SEMICONDUCTOR STRUCTURE AND METHOD FOR FORMING THE SAME

BACKGROUND OF THE INVENTION

1. Field of the Invention

The present invention is related to a semiconductor structure and a method for forming the same. More particularly, the present invention is related to a semiconductor structure with air gaps formed between the interconnecting structures and a method for forming the same.

2. Description of the Prior Art

As the progress of the semiconductor manufacturing technology, the dimensions of the electrical devices and interconnecting structures of an integrated circuit (IC) are shrunk to achieve a higher density. However, the reduction in widths and spaces of the interconnecting structures may cause increased resistance and parasitic capacitance, which may lead to an obvious RC delay effect to the integrated circuit and impact the speed and performance of the integrated circuit.

Currently, to reduce the influence of the RC delay effect, low resistance metals (such as copper) are used to form the interconnecting structures and low-k dielectric materials are used to form the insulating supporting structure between the interconnecting structures. In advanced semiconductor technology such as ultra-large-scale integration (VLSI), the parasitic capacitance may be further reduced to meet the lower RC delay requirement by introducing air gaps which may have a dielectric constant as low as 1 between the interconnecting structures. However, there are still problems need to be improved. For example, the sizes of the air gaps are too small to effectively reduce the parasitic capacitance, and the risk of structural collapses due to insufficient mechanical supporting of the low-k dielectric materials may be increased.

SUMMARY OF THE INVENTION

In light of the above, the present invention is directed to provide a semiconductor structure and a method for forming the same, which particularly uses a silicon layer to at least partially seal an air gap between the interconnecting structures of the semiconductor structure. In this way, the purpose of reducing the parasitic capacitance and RC delay effect of the interconnecting structures and reducing the risk of structure collapse may be achieved at the same time.

According to an embodiment of the present invention, a method for forming a semiconductor structure includes the steps of forming a first dielectric layer on a substrate, forming a plurality of first interconnecting structures in the first dielectric layer, forming at least a trench in the first dielectric layer between the plurality of first interconnecting structures, performing a sputtering deposition process to form a second dielectric layer on the first dielectric layer and at least partially sealing an air gap in the trench, and forming a third dielectric layer on the second dielectric layer.

According to another embodiment of the present invention, a method for forming a semiconductor structure includes the steps of forming a first dielectric layer on a substrate, forming a plurality of first interconnecting structures in the first dielectric layer, forming at least a trench in the first dielectric layer between the plurality of first interconnecting structures, performing a sputtering deposition process to form a second dielectric layer on the first dielectric layer and sealing an air gap in the trench, and performing a planarization process to the second dielectric layer.

According to still another embodiment of the present invention, a semiconductor structure includes a first dielectric layer disposed on a substrate, a plurality of first interconnecting structures disposed in the first dielectric layer, a silicon oxide layer disposed on the first dielectric layer and sealing an air gap between the plurality of first interconnecting structures, and a low-k dielectric layer disposed on the silicon oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
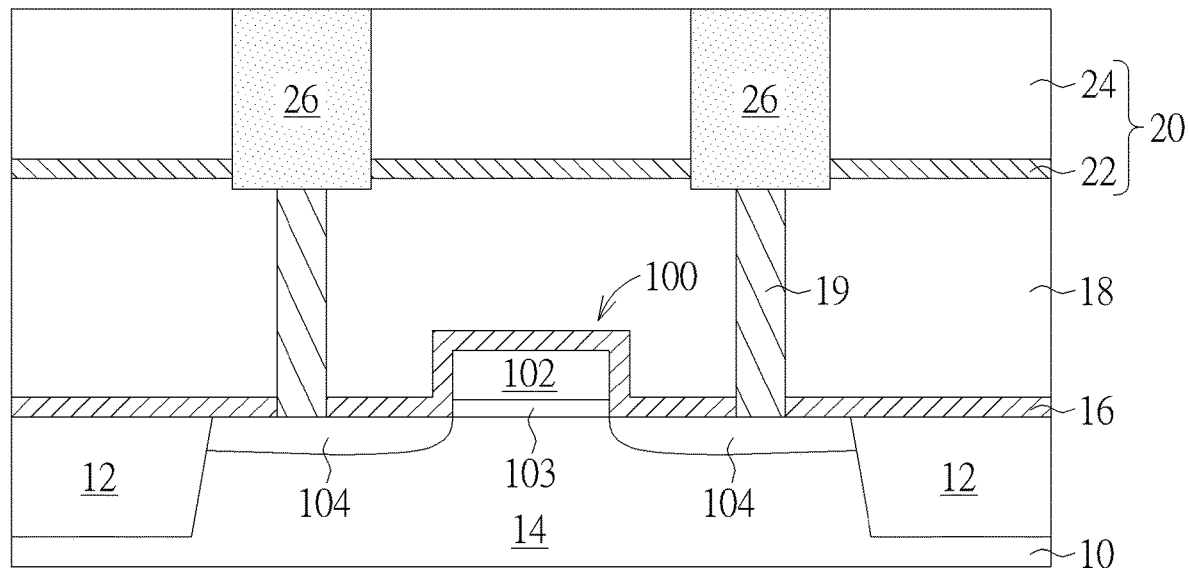
FIG. 1, FIG. 2, FIG. 3, FIG. 4, FIG. 5, FIG. 6, FIG. 7 and FIG. 8 are schematic diagrams illustrating a method for forming a semiconductor structure according to an embodiment of the present invention.

In the following disclosure, details will be described with reference to the drawings. The contents of the drawings also form part of the detailed description of the specification, and are illustrated by way of specific examples in which the embodiment can be implemented. The following examples have described sufficient details to enable those of ordinary skill in the art to practice. Of course, other embodiments may be adopted, or any structural, logical, and electrical changes may be made without departing from the embodiments described herein. Therefore, the following detailed description should not be taken as limiting, but rather, the embodiments contained herein will be defined by the appended claims.

The term "low-k dielectric material" as used in the present invention refers to a dielectric material having a dielectric constant less than the dielectric constant of the silicon oxide (about 3.9). For example, the low-k dielectric materials used in the present invention may have a dielectric constant between 2.5 and 3.5. The low-k dielectric materials used in the present invention may include fluorinated silicate glass (FSG), fluorinated carbon-doped silicon oxide (SiCOF), hydrogenated silicon oxycarbide (SiCOH), hydrogenated silicon carbonitride (SiCN:H), hydrogenated oxidized silicon carbon, SiLK®, polyimide, organosilicate glass (OSG), parylene, methyl siloxane-silica, polymethylmethacrylate (PMMA), FLARE®, organosilicate glass (OSG), hydrogen silsesquioxane (HSQ), methylsilsesquioxane (MSQ), or a combination thereof, but are not limited thereto.

The term "air gap" as used in the present invention refers to a void sealed in the semiconductor structure by a layer or multiple layers of dielectric layers. The air gap may be a vacuum void, or may be at least partially filled with air or inert gases. In the embodiments illustrated in the following description, the air gap of the semiconductor structure is formed in a trench between the neighboring interconnecting structures. It should be understood by the skilled person in the art that the air gap may be formed in other portions of the semiconductor structure as required.

FIG. 1, FIG. 2, FIG. 3, FIG. 4, FIG. 5, FIG. 6, FIG. 7 and FIG. 8 are schematic diagrams illustrating the successive steps of a method for forming a semiconductor structure according to an embodiment of the present invention. Please refer to FIG. 1, a substrate 10 is provided. The substrate 10 may be a silicon substrate, an epitaxial silicon substrate, a silicon germanium (SiGe) substrate, a silicon carbide (SiC) substrate, or a silicon-on-insulator (SOI) substrate, but is not limited thereto. An etching stop layer 16, an interlayer dielectric layer 18, and a first dielectric layer 20 are successively formed on the substrate 10.

The substrate 10 may include a plurality of isolation structures 12 and an active region 14 defined in the substrate 10 by the isolation structures 12. At least a semiconductor device 100 may be formed in the active region 14. According to an embodiment of the present invention, the semiconductor device 100 may include a metal oxide semiconductor field effect transistor (MOSFET) and includes a gate structure 102 formed on a portion of the active region 14, the source/drain regions 104 formed in the active region 14 at two sides of the gate structure 102, and the gate dielectric layer 103 formed between the gate structure 102 and the active region 14. It should be understood that the substrate 10 may include other active or passive electrical devices such as, but not limited to, diodes, thyristors, memories, light emitting devices, resistors, capacitors, and inductors, which are not shown in the drawings for the sake of simplicity.

The etching stop layer 16 is formed on the substrate 10 and covers the gate structure 102. The interlayer dielectric layer 18 is formed on the etching stop layer 16 in a blanket manner and is planarized to form a flat top surface for the convenience of forming subsequent interconnecting structures. A plurality of contact plugs 19 are formed in the interlayer dielectric layer 18 and penetrates through the etching stop layer 16 to contact and electrically connect to the semiconductor device 100. Although only the contact plugs 19 disposed on the source/drain regions 104 are shown in FIG. 1, it should be understood that a contact plug (not shown) may also be provided on a portion of the gate structure 102 to contact and electrically connect to the gate structure 102. In the process for forming the contact plugs 19, the etching stop layer 16 may be used as an etching stop layer to control the etching depth of the contact holes for forming the contact plugs 19. In some embodiments, the etching stop layer 16 may include a stress in accordance with the conductivity type of the semiconductor device 100 in order to improve the performance of the semiconductor device 100. For example, when the semiconductor device 100 is a p-type MOSFET, the etching stop layer 16 may include a compressive stress. On the other hand, when the semiconductor device 100 is an n-type MOSFET, the etching stop layer 16 may include a tensile stress. The etching stop layer 16 may be single layered or multiple layered, and may be made of a dielectric material such as carbon doped oxide (CDO), silicon oxycarbide (SiOC), silicon nitride (SiN), silicon oxynitride (SiON), silicon carbon nitride (SiCN), nitride doped silicon carbide (NDC), or a combination thereof, but are not limited thereto. According to an embodiment of the present invention, the etching stop layer 16 may include SiN. The interlayer dielectric layer 18 may be single layered or multiple layered, and may include a dielectric material such as silicon oxide (SiO2), un-doped silicon glass (USG), fluorinated silicate glass (FSG), a low-k dielectric material, or a combination thereof, but are not limited thereto. According to an embodiment of the present invention, the interlayer dielectric layer 18 may include silicon oxide. The contact plugs 19 may include a metal material such as cobalt (Co), copper (Cu), aluminum (Al), tungsten (W), nickel (Ni), platinum (Pt), tantalum (Ta), titanium (Ti), a compound of the above metals, a composite layer or an alloy of the above metals, but are not limited thereto. According to an embodiment of the present invention, the contact plugs 19 may include tungsten (W).

The first dielectric layer 20 may be mostly made of a dielectric material layer 24. Optionally, the first dielectric layer 20 may include an etching stop layer 22 under the dielectric material layer 24 and between the dielectric material layer 24 and the interlayer dielectric layer 18. The dielectric material layer 24 may include a dielectric material, such as a low-k dielectric material. The etching stop layer 22 is made of a dielectric material such as SiN, SiON, SiCN, or NDC, but is not limited thereto. The material of the etching stop layer 22 is different from the dielectric material layer 24 to provide an etching selectivity over the dielectric material layer 24. According to an embodiment of the present invention, the etching stop layer 22 may include SiCN.

A plurality of first interconnecting structures 26 may be formed in the first dielectric layer 20 through semiconductor manufacturing processes such as photolithography process, etching process, deposition process, and planarization process. The bottom portions of the first interconnecting structures 26 may penetrate through the etching stop layer 22 to contact and electrically connect to the contact plugs 19. The first interconnecting structures 26 may include a metal material such as cobalt (Co), copper (Cu), aluminum (Al), tungsten (W), nickel (Ni), platinum (Pt), tantalum (Ta), titanium (Ti), a compound of the above metals, a composite layer or an alloy of the above metals, but are not limited thereto. According to an embodiment of the present invention, the first interconnecting structures 26 may include copper (Cu). As shown in FIG. 1, the bottom portions of the first interconnecting structures 26 may extend to be lower than the lower surface of the etching stop layer 22 and into an upper portion of the interlayer dielectric layer 18. It should be understood that the first dielectric layer 20 may include other interconnecting structures (not shown) that are used for lateral routing and the bottom portions of the interconnecting structures (not shown) are not in contact with any contact plugs.

Figure 2:
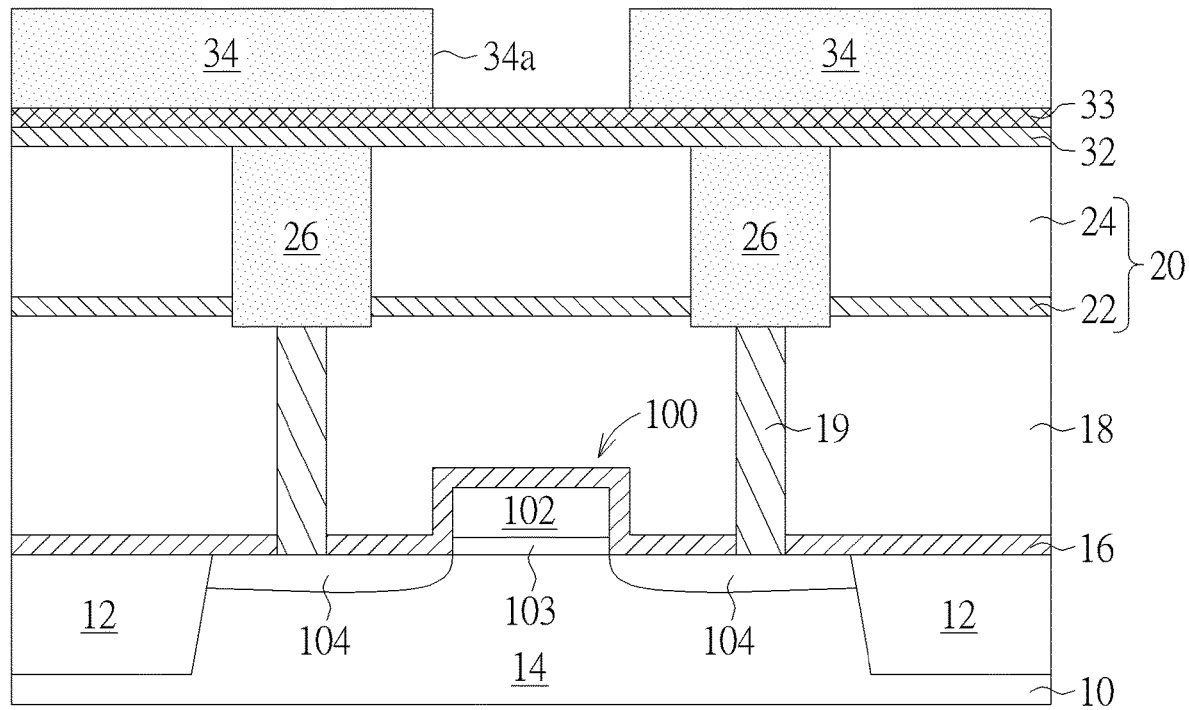

Please refer to FIG. 2. Subsequently, an etching stop layer 32, a hard mask layer 33, and a photoresist layer 34 are formed on the first dielectric layer 20 (on the dielectric material layer 24). The materials suitable to form the etching stop layer 32 may be referred to the material of the etching stop layer 16 and will not be repeated herein for the sake of simplicity. According to an embodiment of the present invention, the etching stop layer 32 may include SiN. The material of the hard mask layer 33 is different from the material of the etching stop layer 32 to be able to be selectivity removed from the etching stop layer 32 in later process. According to an embodiment of the present invention, the hard mask layer 33 may include titanium nitride (TiN). The photoresist layer 34 is patterned to form at least a first opening 34a to expose a portion of the hard mask layer 33.

Figure 3:
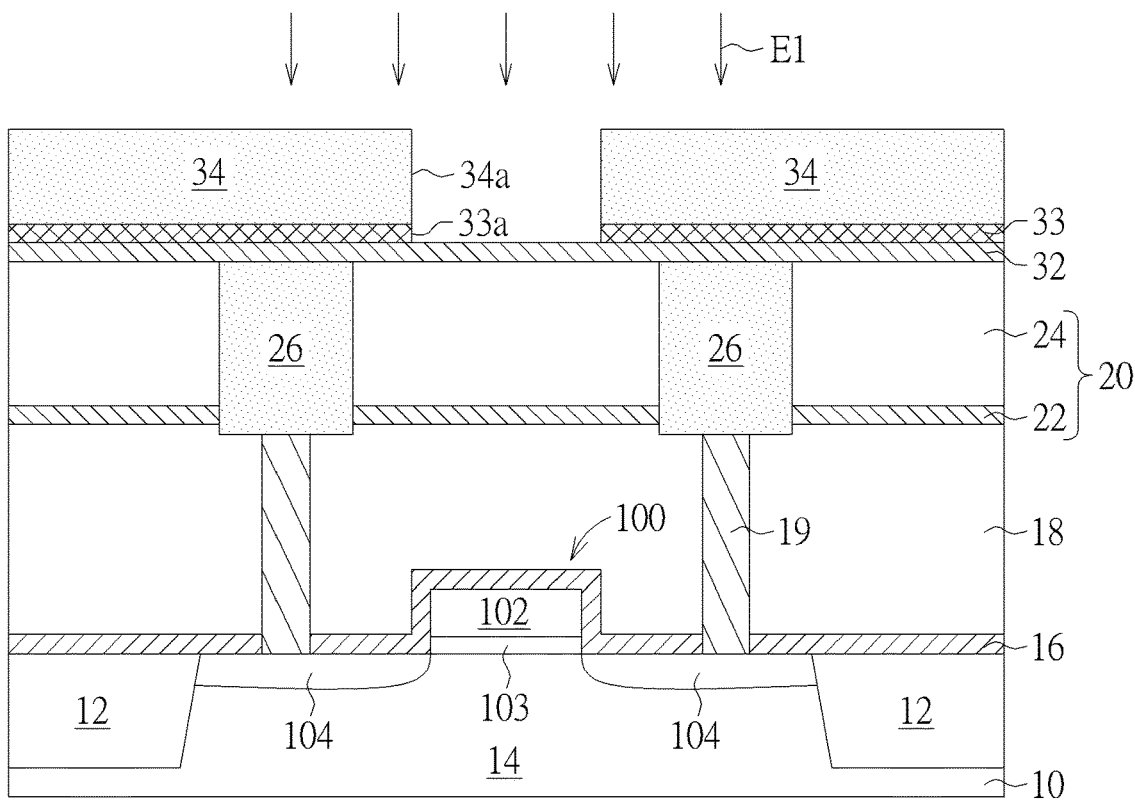

Please refer to FIG. 3. Subsequently, a first etching process E1 is performed to etch the hard mask layer 33 through the first opening 34a to form a second opening 33a in the hard mask layer 33 to expose a portion of the etching stop layer 32.

Figure 4:
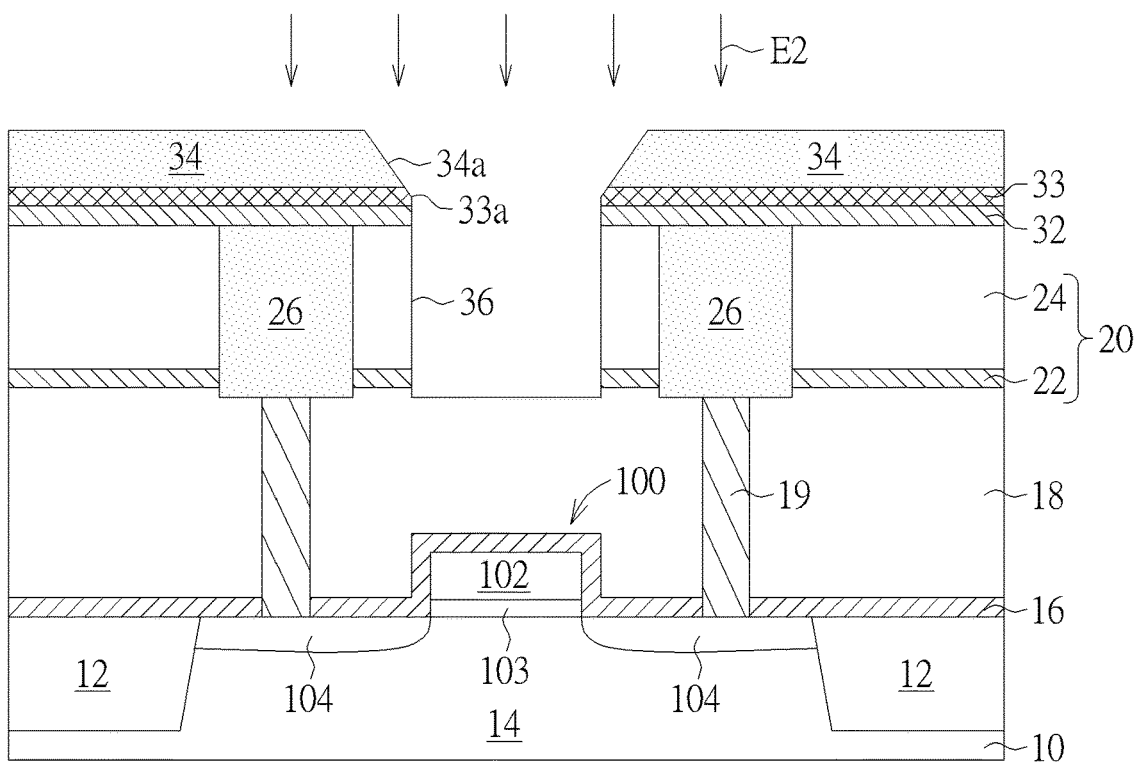
Figure 4A:
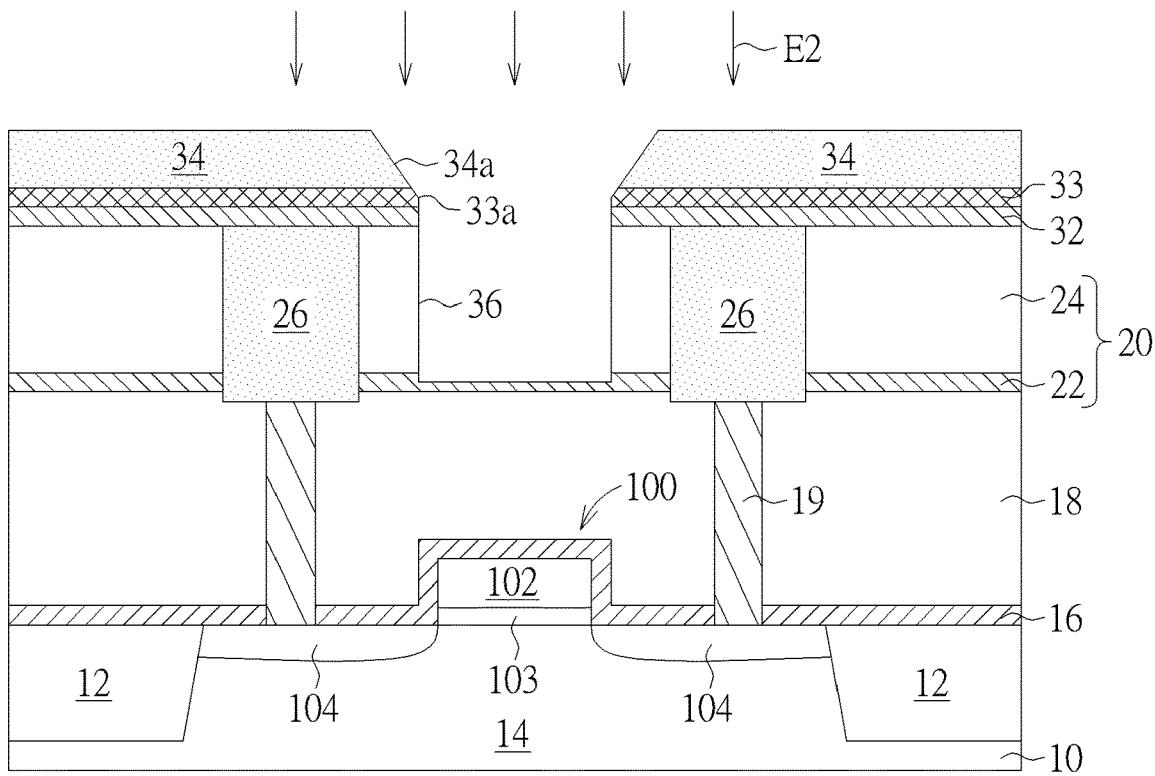
FIG. 4A is a schematic diagram showing a variant of the step shown in FIG. 4.
Figure 4B:
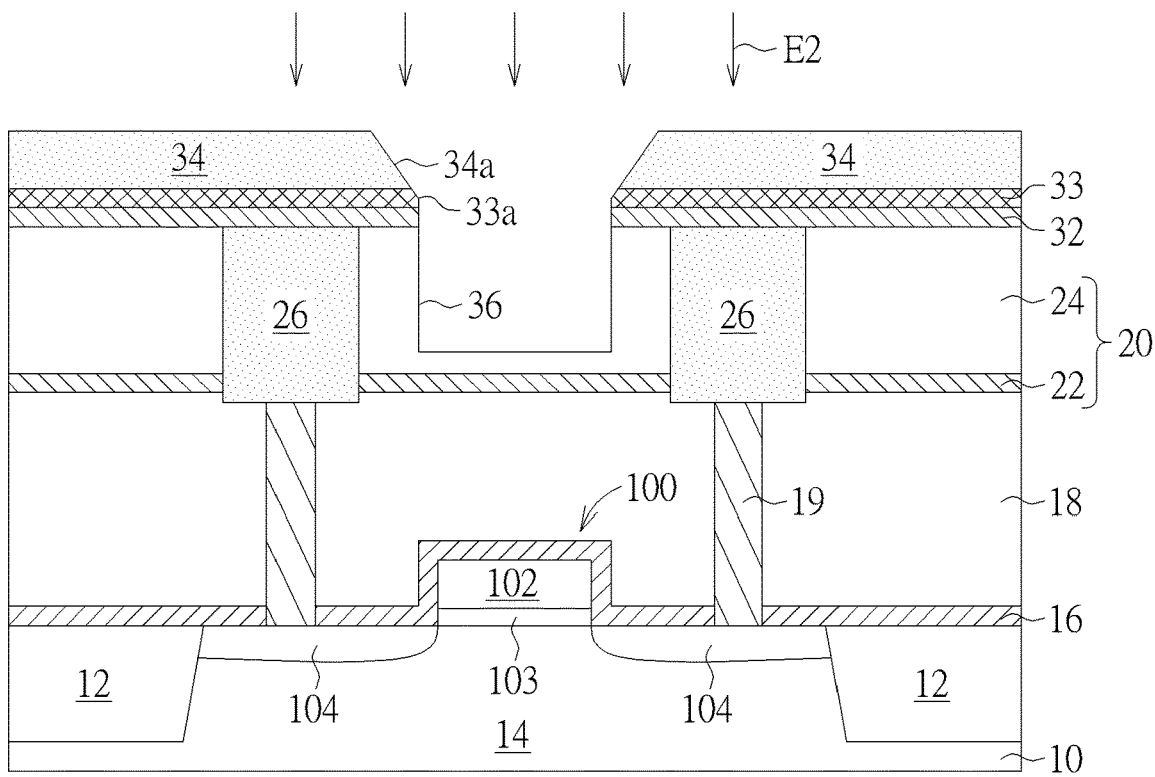
FIG. 4B is a schematic diagram showing another variant of the step shown in FIG. 4.

Please refer to FIG. 4. Following, a second etching process E2 is performed to etch the etching stop layer 32 and the first dielectric layer 20 through the first opening 34a and the second opening 33a to form at least a trench 36 in the first dielectric layer 20 and between the first interconnecting structures 26. In some embodiments, as shown in FIG. 4, the second etching process E2 may etch through the whole thickness of the first dielectric layer 20 (through the etching stop layer 22) and continue to etch an upper portion of the interlayer dielectric layer 18, so that the bottom portion of the trench 36 may extend into the upper portion of the interlayer dielectric layer 18, and the bottom portion of the trench 36 may be at a horizontal level substantially flush with or a little higher than the bottom portions of the first interconnecting structures 26. In some embodiments, as shown in FIG. 4A, the second etching process E2 may etch through the dielectric material layer 24 but not through the etching stop layer 22 of the first dielectric layer 20, so that the bottom portion of the trench 36 is terminated in the etching stop layer 22. In some embodiments, as shown in FIG. 4B, the second etching process E2 does not etch through the dielectric material layer 24 of the first dielectric layer 20, so that the bottom portion of the trench 36 is terminated in the dielectric material layer 24 of the first dielectric layer 20. According to an embodiment of the present invention, after the second etching process E2, the sidewalls of the first interconnecting structures 26 are completely covered by the dielectric material layer 24 of the first dielectric layer 20. The trench 36 does not expose any portion of the first interconnecting structures 26.

Figure 5:
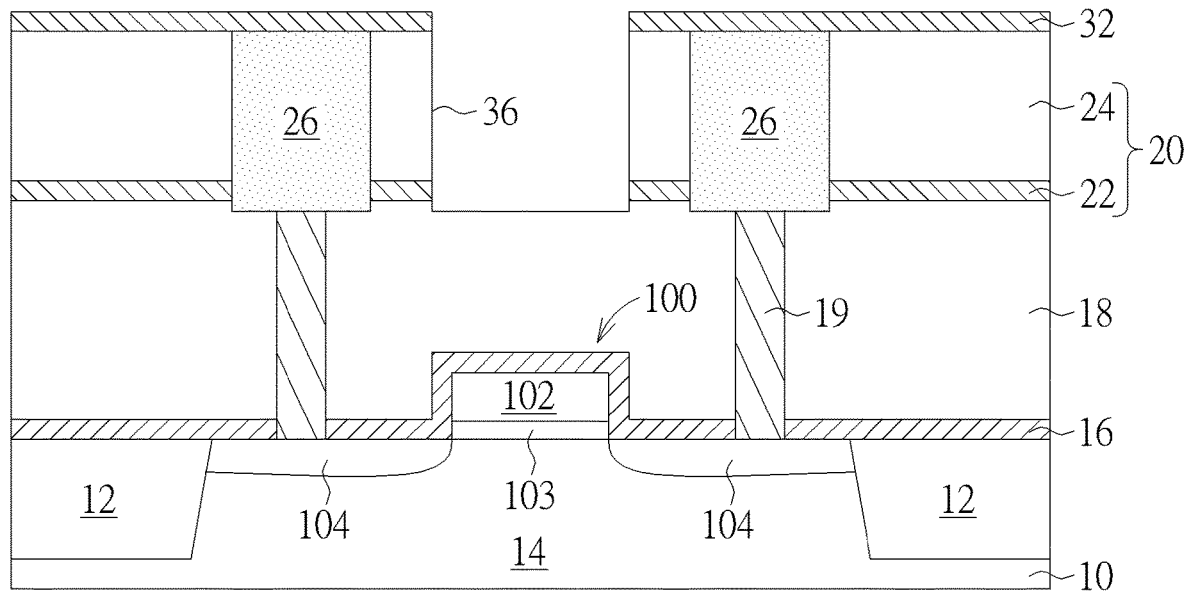

Please refer to FIG. 5. After forming the trench 36, the remaining portions of the photoresist layer 34 and hard mask layers 33 (shown in FIG. 4) are completely removed from the etching stop layer 32 to expose a surface of the etching stop layer 32.

Figure 6:
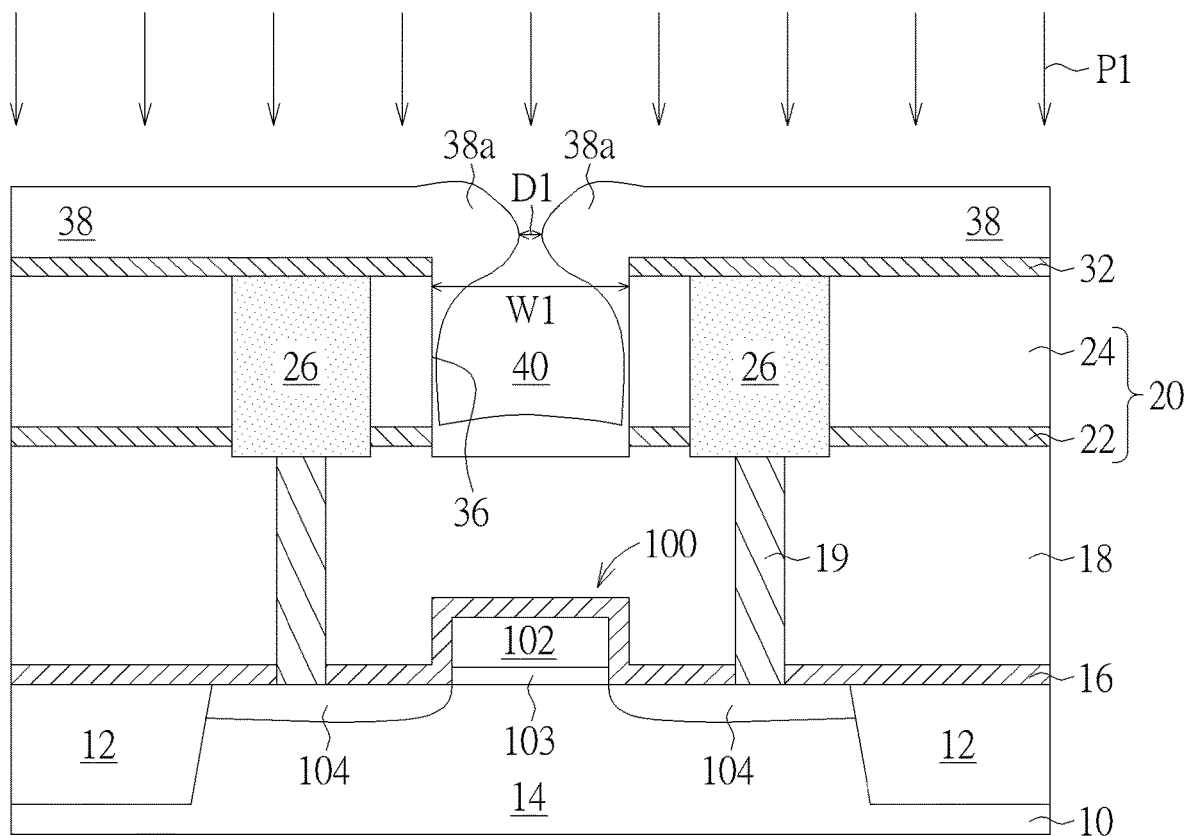

Please refer to FIG. 6. Subsequently, a sputtering deposition process P1 is performed to form a second dielectric layer 38 on the first dielectric layer 20. A portion of the second dielectric layer 38 may fill into the trench 36 to cover the sidewalls and bottom surface of the trench 36. The sputtering deposition process P1 may include ion-beam sputtering process, ion-assisted deposition process, reactive sputtering, high-power impulse magnetron sputtering (HIPIMS), or glow sputtering, but are not limited thereto. According to an embodiment of the present invention, the sputtering deposition process P1 may include the steps of transferring the substrate 10 to a reaction chamber, using RF accelerated ions such as argon (Ar) ions to bombard a surface of a target material to make the atoms or molecules of the target material be struck out from the surface of the target material and deposited on the surface of substrate 10. According to an embodiment of the present invention, the second dielectric layer 38 is a silicon oxide layer. The target material for forming the second dielectric layer 38 may be a silicon oxide target or other suitable target materials. In some cases, during the sputtering deposition process P1, oxygen gas may be introduced into the reaction chamber to react with the atoms or molecules struck out from the target material to form the material of the second dielectric layer 38. One feature of the present invention is that, by forming the second dielectric layer 38 through the sputtering deposition process P1, the deposition rate of the second dielectric layer 38 in the vertical direction may be significantly lower than in the horizontal direction, and is less likely to fill into the trench 36. Accordingly, obvious overhang portions 38a of the second dielectric layer 38 may be formed at the opening of the trench 36 to at least partially seal an air gap 40 in the trench 36 while the second dielectric layer 38 deposited on the sidewalls and/or bottom surface of the trench 36 is still thin in thickness. According to an embodiment of the present invention, the sputtering deposition process P1 may be continued until the distance D1 between the overhang portions 38a at two sides of the opening of the trench 36 is approximately equal to or smaller than ¼ of the width W1 of the opening.

Figure 7:
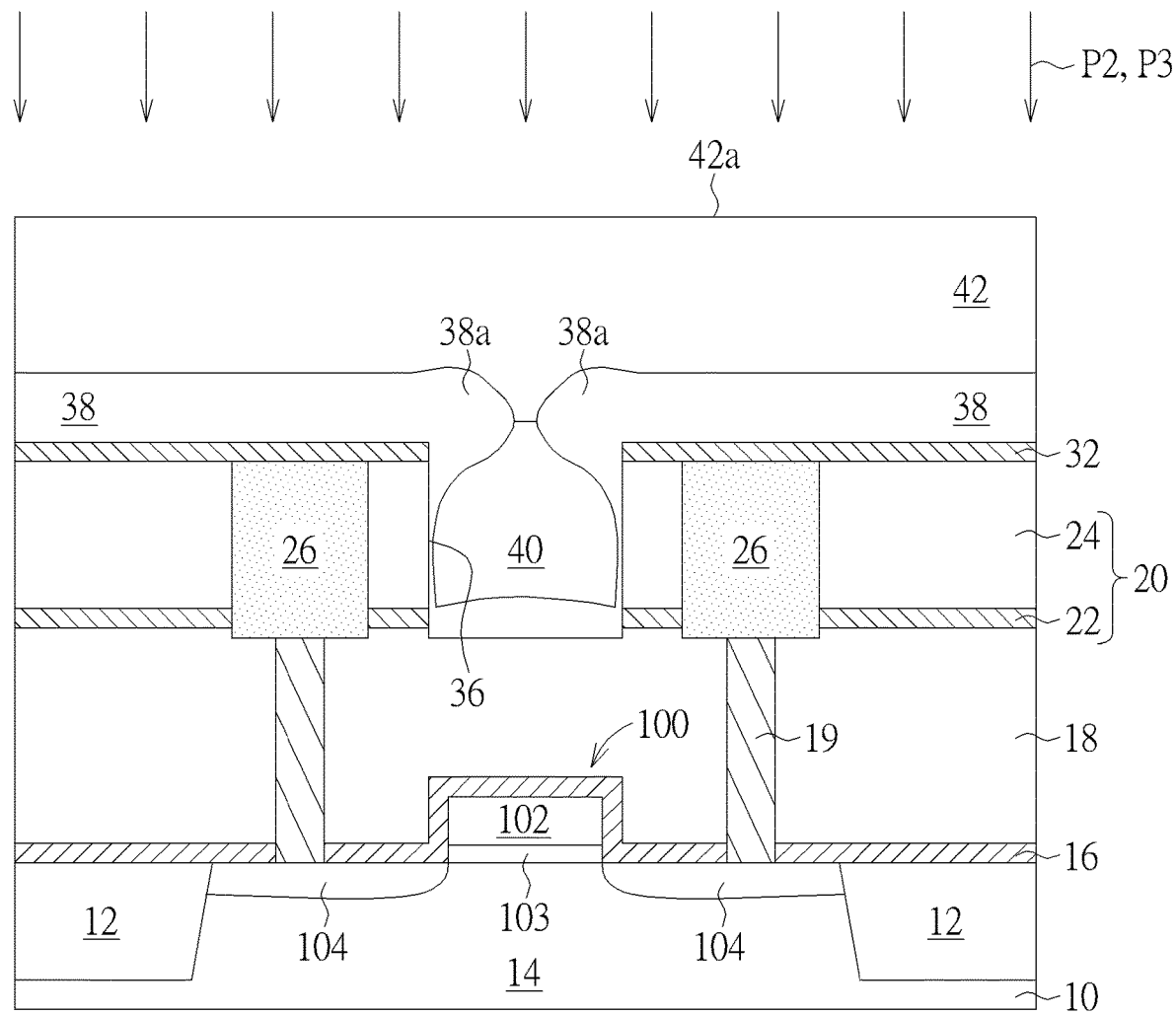

Please refer to FIG. 7. Subsequently, a deposition process P2 may be performed to form a third dielectric layer 42 on the second dielectric layer 38. The air gap 40 is completely sealed by the third dielectric layer 42. A planarization process P3 may be performed to the third dielectric layer 42 until a planar surface 42a of the third dielectric layer 42 is obtained. The deposition process P2 may include chemical vapor deposition (CVD) process, plasma-enhanced chemical vapor deposition (PECVD) process, spin-on process, but is not limited thereto. According to an embodiment of the present invention, the deposition process P2 is a chemical vapor deposition (CVD) process. According to an embodiment of the present invention, the third dielectric layer 42 may include a low-k dielectric material.

Figure 8:
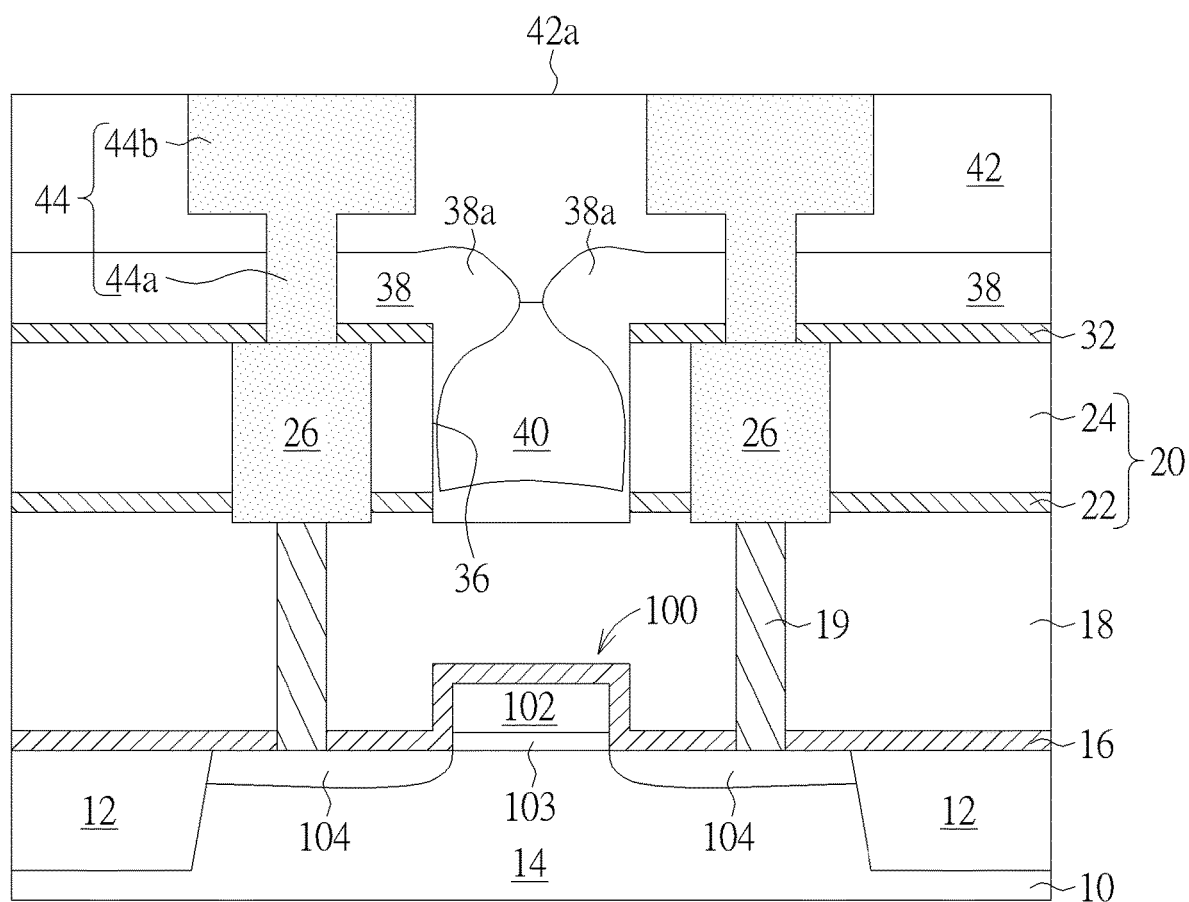

Please refer to FIG. 8. Following, a plurality of second interconnecting structures 44 may be formed in the second dielectric layer 38 and the third dielectric layer 42 through semiconductor manufacturing processes such as photolithography process, etching process, deposition process, and planarization process. As shown in FIG. 8, the second interconnecting structures 44 may respectively include a via portion 44a and a routing portion 44b on the via portion 44a. The bottom portions of the via portions 44a penetrate through the second dielectric layer 38 and the etching stop layer 32 to contact and electrically connect to the first interconnecting structures 26. The top portions of the routing portions 44b are exposed from the third dielectric layer 42 and are flush with the surface 42a of the third dielectric layer 42. Some of the top portions of the routing portions 44b may be electrically connected to the upper interconnecting structure (not shown) that are formed in later processes. The material of the second interconnecting structures 44' may include a metal such as cobalt (Co), copper (Cu), aluminum (Al), tungsten (W), nickel (Ni), platinum (Pt), tantalum (Ta), titanium (Ti), a compound of the above metals, a composite layer or an alloy of the above metals, but are not limited thereto. According to an embodiment of the present invention, the second interconnecting structures 44 may include copper (Cu). It should be understood that the second dielectric layer 38 and the third dielectric layer 42 may include other interconnecting structures (not shown) that are used for lateral routing and the bottom portions of interconnecting structures (not shown) are not in contact with any first interconnecting structures 26.

Please continue to refer to FIG. 8, which shows a semiconductor structure according to an embodiment of the present invention. The semiconductor structure includes a substrate 10 and a first dielectric layer 20 disposed on the substrate 10. An etching stop layer 16 and an interlayer dielectric layer 18 may be disposed between the substrate 10 and the first dielectric layer 20. A plurality of first interconnecting structures 26 are disposed in the first dielectric layer 20. At least a trench 36 is formed in the first dielectric layer 20 between the first interconnecting structures 26. A second dielectric layer 38 (for example, a silicon oxide layer) is disposed on the first dielectric layer 20 and extends into the trench 36 to partially seal an air gap 40 in the trench 36. A third dielectric layer 42 (for example, a low-k dielectric layer) is disposed on the second dielectric layer 38 and completely seals the air gap 40. That is, the second dielectric layer 38 and the third dielectric layer 42 together seal the air gap 40. In comparison with conventional technology mostly using low-k dielectric materials to seal the air gap and form the insulating supporting structure between the interconnecting structures, in the semiconductor structure shown in FIG. 8, the second dielectric layer 38 made of silicon oxide (providing better structural supporting to the semiconductor structure) and the third dielectric layer 42 made of low-k dielectric material (providing less structural supporting to the semiconductor structure) are used concurrently to seal the air gap 40 and to form the insulating supporting structure between the interconnecting structures. In this way, the parasitic capacitance between the interconnecting structures and the resulting RC delay effect may be reduced while the risk of structure collapse may also be reduced. Additionally, the present invention using the sputtering deposition process P1 to form the second dielectric layer 38 may easily form obvious overhang portions 38a at two sides of the opening of the trench 36 while the second dielectric layer 38 filling into the trench 36 is still thin in thickness. In this way, a larger air gap 40 may be formed in the trench 36 and the parasitic capacitance may be further reduced. In some embodiments, as shown in FIG. 8, the sidewalls and bottom surface of the trench 36 may be completely covered by the second dielectric layer 38, so that the air gap 40 would not be in direct contact with the first dielectric layer 20. It some embodiments, the sidewalls and bottom surface of the trench 36 may be partially covered by the second dielectric layer 38, so that the air gap 40 may be in direct contact with the first dielectric layer 20, the etching stop layer 22, and/or the interlayer dielectric layer 18.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
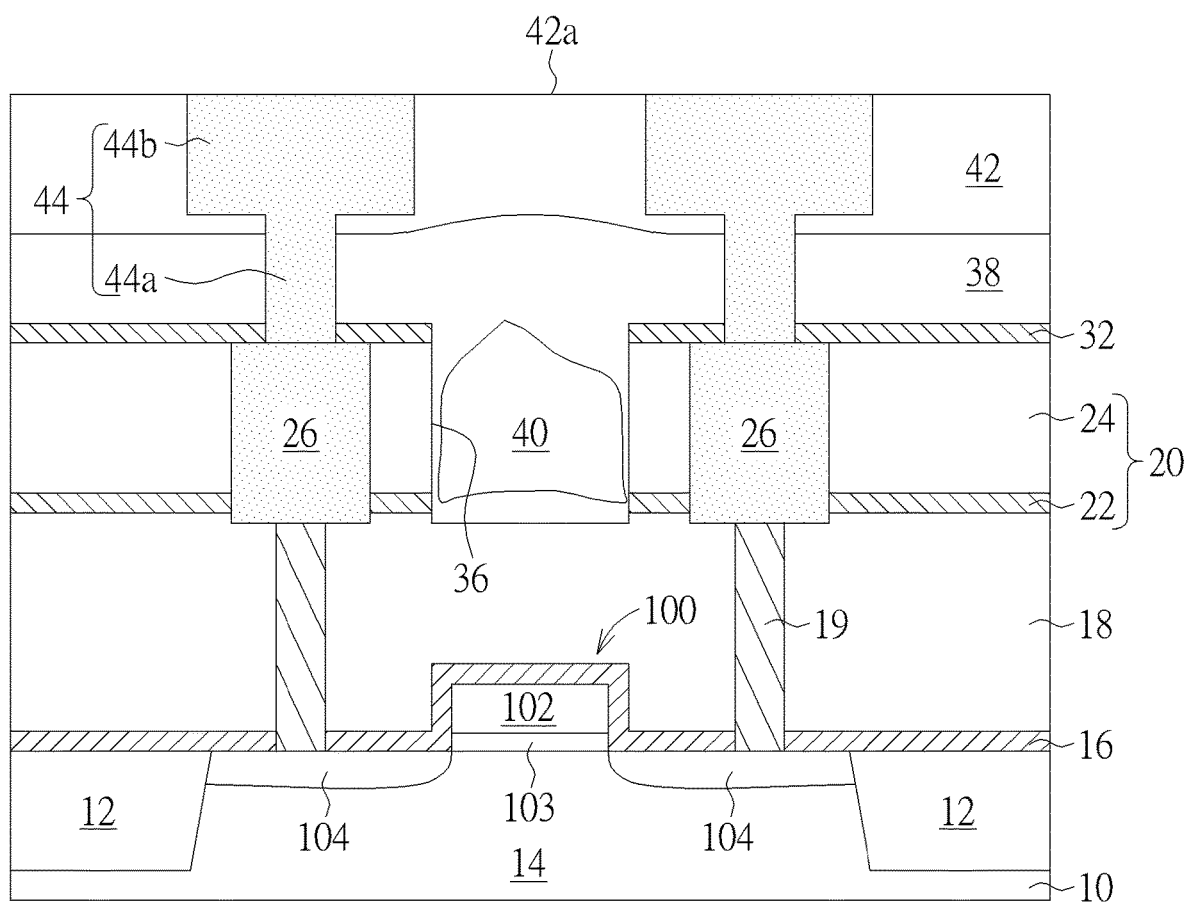
FIG. 9 is a schematic diagram showing a cross-sectional view of a semiconductor structure according to another embodiment of the present invention.

FIG. 9 is a schematic diagram showing a cross-sectional view of a semiconductor structure according to another embodiment of the present invention, which is different from the semiconductor structure shown in FIG. 8 in that, the deposition (the sputtering deposition process P1 shown in FIG. 6) of the second dielectric layer 38 may be continued until the overhang portions 38a (shown in FIG. 6) of the second dielectric layer 38 at two sides of the opening of the trench are merged to completely seal the air gap 40. Therefore, the air gap 40 and the third dielectric layer 42 are not in direct contact with each other.

Figure 10:
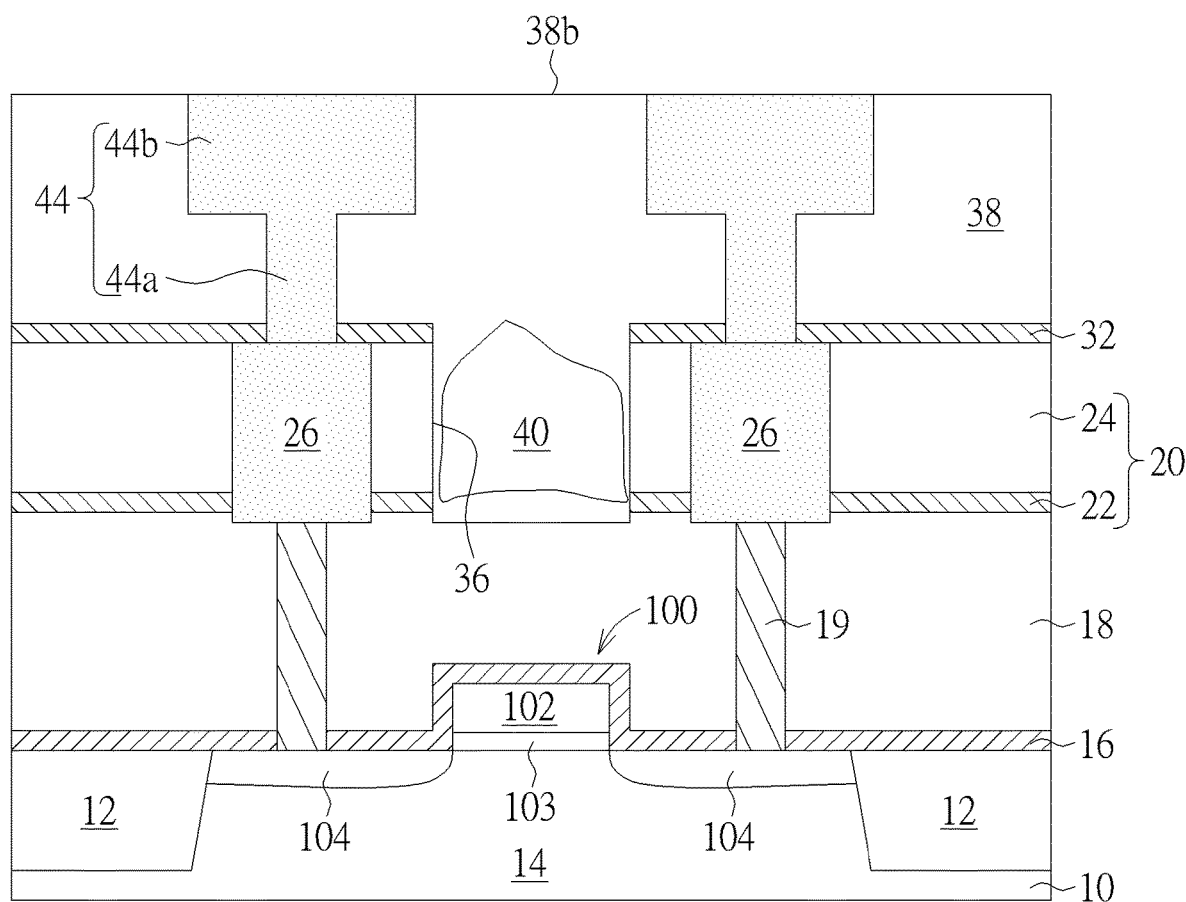
FIG. 10 is a schematic diagram showing a cross-sectional view of a semiconductor structure according to still another embodiment of the present invention.

FIG. 10 is a schematic diagram showing a cross-sectional view of a semiconductor structure according to still another embodiment of the present invention, which is different from the semiconductor structure shown in FIG. 8 in that, the deposition (the sputtering deposition process P1 shown in FIG. 6) of the second dielectric layer 38 may be continued until the air gap 40 is completely sealed and the thickness of the second dielectric layer 38 on the first dielectric layer 20 is sufficient for forming the second interconnecting structures 44. A planarization process may be performed to the second dielectric layer 38 until a planar surface 38b of the second dielectric layer 38 is obtained, and then the second interconnecting structures 44 are formed in the second dielectric layer 38. The top portions of the second interconnecting structures 44 are flush with the surface 38b of the second dielectric layer 38. The semiconductor structure shown in FIG. 10 uses the second dielectric layer 38 made from sputtering silicon oxide to seal the air gap 40 and to serve as the insulating supporting structure between the second interconnection structure 44, so that an enlarged air gap 40 may be obtained while a better structural support may also be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   forming a first dielectric layer on a substrate;
   forming a plurality of first interconnecting structures in the first dielectric layer;
   forming at least a trench in the first dielectric layer between the plurality of first interconnecting structures, wherein none of the plurality of first interconnecting structures is exposed from the trench;
   performing a sputtering deposition process to form a second dielectric layer on the first dielectric layer and at least partially sealing an air gap in the trench; and
   forming a third dielectric layer on the second dielectric layer.

2. The method for forming a semiconductor structure according to claim 1, wherein the second dielectric layer comprises silicon oxide.

3. The method for forming a semiconductor structure according to claim 1, wherein the third dielectric layer comprises a low-k dielectric material.

4. The method for forming a semiconductor structure according to claim 1, wherein the first dielectric layer comprises a low-k dielectric material.

5. The method for forming a semiconductor structure according to claim 1, wherein the air gap is completely sealed by the second dielectric layer.

6. The method for forming a semiconductor structure according to claim 1, wherein the air gap is partially sealed by the second dielectric layer and completely sealed by the third dielectric layer.

7. The method for forming a semiconductor structure according to claim 1, further comprising:
   performing a planarization process to the third dielectric layer; and
   forming a plurality of second interconnecting structures through the third dielectric layer and the second dielectric layer to electrically connect to the first interconnecting structures.

8. The method for forming a semiconductor structure according to claim 1, wherein the step of forming the trench comprises:
   forming a hard mask layer on the first dielectric layer;
   forming a photoresist layer on the hard mask layer and a first opening in the photoresist layer to expose a portion of the hard mask layer;
   through the first opening, etching the hard mask layer to form a second opening in the hard mask layer;
   through the first opening and the second opening, etching the first dielectric layer to form the trench; and removing the photoresist layer and the hard mask layer completely.

9. The method for forming a semiconductor structure according to claim 8, wherein the hard mask layer comprises titanium nitride (TiN).

10. A method for forming a semiconductor structure, comprising:
- forming a first dielectric layer on a substrate;
- forming a plurality of first interconnecting structures in the first dielectric layer;
- forming at least a trench in the first dielectric layer between the plurality of first interconnecting structures, wherein none of the plurality of first interconnecting structures is exposed from the trench;
- performing a sputtering deposition process to form a second dielectric layer on the first dielectric layer and sealing an air gap in the trench; and
- performing a planarization process to the second dielectric layer.

11. The method for forming a semiconductor structure according to claim 10, wherein the second dielectric layer comprises silicon oxide.

12. The method for forming a semiconductor structure according to claim 10, further comprising forming a plurality of second interconnecting structures through the second dielectric layer to electrically connect to the first interconnecting structures.

13. The method for forming a semiconductor structure according to claim 10, wherein the step of forming the trench comprises:
- forming a hard mask layer on the first dielectric layer;
- forming a photoresist layer on the hard mask layer and a first opening in the photoresist layer to expose a portion of the hard mask layer;
- through the first opening, etching the hard mask layer to form a second opening in the hard mask layer;
- through the first opening and the second opening, etching the first dielectric layer to form the trench; and
- removing the photoresist layer and the hard mask layer completely.

14. The method for forming a semiconductor structure according to claim 13, wherein the hard mask layer comprises titanium nitride (TiN).

15. A semiconductor structure, comprising:
- a first dielectric layer disposed on a substrate;
- a plurality of first interconnecting structures disposed in the first dielectric layer;
- a silicon oxide layer disposed on the first dielectric layer and sealing an air gap between the plurality of first interconnecting structures, wherein the silicon oxide layer is completely separated from the plurality of first interconnecting structures by the first dielectric layer; and
- a low-k dielectric layer disposed on the silicon oxide layer.

16. The semiconductor structure according to claim 15, wherein the air gap is completely sealed by the silicon oxide layer.

17. The semiconductor structure according to claim 15, wherein the air gap is completely sealed by the silicon oxide layer and the low-k dielectric layer.

* * * * *